(12) United States Patent
Thompson et al.

(10) Patent No.: US 6,884,901 B2
(45) Date of Patent: Apr. 26, 2005

(54) METHODS FOR MAKING METALLOCENE COMPOUNDS

(75) Inventors: David M. Thompson, Williamsville, NY (US); Cynthia A. Hoover, Grand Island, NY (US)

(73) Assignee: Praxair Technology, Inc., Danbury, CT (US)

( * ) Notice: Subject to any disclaimer, the term of this patent is extended or adjusted under 35 U.S.C. 154(b) by 59 days.

(21) Appl. No.: 10/685,777

(22) Filed: Oct. 16, 2003

(65) Prior Publication Data

US 2004/0127732 A1 Jul. 1, 2004

Related U.S. Application Data

(60) Provisional application No. 60/453,717, filed on Apr. 18, 2003, provisional application No. 60/453,719, filed on Apr. 18, 2003, provisional application No. 60/453,718, filed on Apr. 18, 2003, provisional application No. 60/446,320, filed on Feb. 7, 2003, provisional application No. 60/427,461, filed on Nov. 18, 2002, provisional application No. 60/426,284, filed on Nov. 14, 2002, provisional application No. 60/422,947, filed on Oct. 31, 2002, and provisional application No. 60/422,946, filed on Oct. 31, 2002.

(51) Int. Cl.[7] .......................... C07F 17/00; C23C 16/00
(52) U.S. Cl. ........................ 556/136; 556/143; 427/587; 427/593
(58) Field of Search ........................ 556/136, 143; 427/587, 593

(56) References Cited

U.S. PATENT DOCUMENTS

| | | | | |
|---|---|---|---|---|
| 3,035,978 A | * | 5/1962 | Moss et al. .................. | 514/502 |
| 3,109,852 A | * | 11/1963 | Leslie ......................... | 556/143 |
| 3,259,642 A | * | 7/1966 | Schenck et al. .............. | 556/7 |
| 3,294,685 A | * | 12/1966 | Stevens et al. ............... | 44/361 |
| 3,535,356 A | * | 10/1970 | Hartle et al. ................. | 556/143 |
| 6,002,036 A | | 12/1999 | Kadokura .................... | 556/136 |
| 6,207,232 B1 | | 3/2001 | Kadokura .................... | 427/252 |
| 6,521,772 B1 | | 2/2003 | Lienhard et al. ............. | 556/136 |
| 2002/0161253 A1 | * | 10/2002 | Voll et al. .................... | 556/143 |

FOREIGN PATENT DOCUMENTS

| | | |
|---|---|---|
| PL | 124360 | 2/1985 |
| WO | WO 03/027127 A1 | 4/2003 |

OTHER PUBLICATIONS

Pertici et al., "Improved Synthesis of Cyclo–olefin Complexes of Ruthenium via Metallic Zinc Reduction", *J.C.S. Chem. Comm.*, 1975, p. 845.

M.I. Bruce et al., "Cyclopentadienyl Complexes", *Inorganic Syntheses* 28:270–272, 1990.

Gautier, "Ligand Exchange in the Reaction of Ferrocene and $RuCl_3$", *J. Chem. Soc. D.* (1969)–690.

* cited by examiner

*Primary Examiner*—Porfirio Nazario-Gonzalez
(74) *Attorney, Agent, or Firm*—Gerald L. Coon

(57) ABSTRACT

A method for producing Group 8 (VIII) metallocene or metallocene-like compounds employs a compound that includes a Cp' anion, such as found, together with a counterion, in a cyclopentadienide or cyclopentadienide-like salt. In one embodiment, the method includes reacting a metal salt, a (Cp) compound, such as a substituted or unsubstituted cyclopentadiene or indene, and a ligand (L) to form an intermediate compound and reacting the intermediate compound with a Cp' compound, eg., a cyclopentadienide or cyclopentadienide-like salt, where the metal salt can be is a ruthenium, an osmium or an iron halide or nitrate and L is an electron pair donor. Unsubstituted, mono-substituted as well as symmetrically or asymmetrically di- or multi-substituted metallocenes or metallocene-like compounds can be produced. In another embodiment, unsubstituted or symmetrically substituted metallocenes are formed by reacting $MX_2(PPh_3)_m$ with a Cp' compound, where m=3 or 4. The method can be used to form precursors for chemical vapor deposition of thin films.

19 Claims, 8 Drawing Sheets

METHODS FOR MAKING METALLOCENE COMPOUNDS

RELATED APPLICATIONS

This application claims the benefit of U.S. Provisional Application No. 60/422,946, filed Oct. 31, 2002; U.S. Provisional Application No. 60/422,947, filed Oct. 31, 2002; U.S. Provisional Application No. 60/426,284, filed Nov. 14, 2002; U.S. Provisional Application No. 60/427,461, filed Nov. 18, 2002; U.S. Provisional Application No. 60/446,320, filed Feb. 7, 2003; U.S. Provisional Application No. 60/453,718, filed Apr. 18, 2003; U.S. Provisional Application No. 60/453,719, filed Apr. 18, 2003; and U.S. Provisional Application No. 60/453,717, filed Apr. 18, 2003. The entire teachings of the above-referenced applications are incorporated herein by reference.

BACKGROUND OF THE INVENTION

Chemical vapor deposition (CVD) methods are employed to form films of material onto substrates such as wafers or other surfaces during the manufacture or processing of semiconductors. In CVD, a CVD precursor, also known as a CVD chemical compound, is decomposed thermally, chemically, photochemically or by plasma activation, to form a thin film having a desired composition. For instance, a vapor phase CVD precursor can be contacted with a substrate that is heated to a temperature higher than the decomposition temperature of the precursor, to form a metal or metal oxide film on the substrate.

Preferably, CVD precursors are volatile, heat decomposable and capable of producing uniform films under suitable CVD conditions. In producing thin films by CVD processes, precursors that are liquid at room temperature, rather than solid, often are preferred.

Thin films that include ruthenium (Ru) or ruthenium oxide ($RuO_2$), for instance, have good electrical conductivity, high work function, are chemically and thermally stable, resistant to inter-layer chemical diffusion and are compatible with many dielectric substrate materials. Ru and $RuO_2$ films, for instance, have been investigated as film electrode material for semiconductor devices such as DRAM (Dynamic Random Access Memory) devices.

Bis(pentahaptocyclopentadienyl)ruthenium (ruthenocene) and the symmetrical, diethyl-substituted ruthenocene (1,1'-diethylruthenocene) have been investigated as possible precursors for forming ruthenium-based thin films by CVD techniques. Both have relatively low vapor pressure (less than 10 Torr at 100° C.). At room temperature, ruthenocene is a solid and 1,1'-diethylruthenocene is a liquid.

To date, ruthenocene or symmetrically substituted 1,1'-diethylruthenocene have been prepared by several synthetic routes.

One existing method for forming ruthenocene includes the reaction of $RuCl_3 \cdot XH_2O$ with cyclopentadiene, in the presence of Zn, to produce ruthenocene, $ZnCl_2$ and HCl, as shown in FIG. 1A. A similar approach, using ethyl-substituted cyclopentadiene, has been employed to produce 1,1'-diethylruthenocene, as shown in FIG. 1B. Generally, yields obtained by this method are about 70%.

As shown in FIG. 1C, unsubstituted ruthenocene also has been prepared by the reaction of cyclopentadiene, chloro(cyclopentadienyl)bis(triphenylphosphine)ruthenium(II) and sodium hydride (NaH) in benzene. Chloro(cyclopentadienyl)bis(triphenylphosphine)ruthenium(II) precursor has been synthesized by reacting ruthenium trichloride and triphenylphosphine in ethanol.

Another method that has been investigated for the synthesis of ruthenocene includes the transmetallation reactions of a bis(alkylcyclopentadienyl)iron compound with $RuCl_3 \cdot XH_2O$ and results in the formation of low yield 1,1'-dialkylruthenocene, iron trichloride ($FeCl_3$) and difficult to separate iron species.

Monosubstituted ruthenocenes, e.g., 1-ethylruthenocene, are formed as an impurity during the synthesis of 1,1'-diethylruthenocene. Tert-butyl(cyclopentadienyl)(cyclopentadienyl)ruthenium also has been prepared by reacting a heated mixture of bis(cyclopentadienyl)ruthenium, aluminum chloride and polyphosphoric acid, with tert-butyl alcohol, followed by distillation.

Generally, synthetic methods described above often are associated with low yields, competing dimerization reactions, require complex product separations, and/or special handling techniques. NaH, for instance, reacts violently with $H_2O$ and also reacts with air.

Furthermore, synthetic approaches shown in FIGS. 1A and 1B include a one step addition of both cycolpentadienyl rings and thus are suitable for preparing unsubstituted ruthenocene or the symmetrically substituted 1,1'-diethylruthenocene, but not asymmetric, di-substituted ruthenocenes, such as $1-D_1,1'-D_1'$-ruthenocenes, where $D_1$ and $D_1'$ are different alkyl groups.

In developing methods for forming thin films by CVD methods, a need continues to exist for methods of preparing precursors that preferably are liquid at room temperature, have relatively high vapor pressure and that can form uniform films. A need also continues to exist for versatile methods of preparing ruthenocenes and other Group 8 (VIII) metallocenes. In particular, a need exists for methods for preparing di- or multi-substituted asymmetric Group 8 (VIII) metallocenes

SUMMARY OF THE INVENTION

The invention generally is directed to a method for producing Group 8 (VIII) metallocene compounds. The compounds generally have a sandwich-type structure similar to that of ferrocene and are represented by the general formula CpMCp', where M is ruthenium (Ru), osmium (Os) and iron (Fe); and Cp and Cp' are $\eta^n$-coordinated cyclic moieties, where n indicates the number of carbon atoms in the cyclic moieties that are believed to be bonded to the metal atom. In specific examples, Cp and Cp' are independently selected to be cyclopentadienyl or indenyl.

In preferred embodiments of the invention, the method includes using a substituted or unsubstituted cyclopentadienyl, indenyl or another $\eta^n$-coordinated cyclic anion, such as present, in combination with a counter-ion, in salt compounds, e.g., in cyclopentadienide salts. Suitable counterions include lithium (Li), sodium (Na), potassium (K), magnesium (Mg), calcium (Ca), thallium (Tl) cations or trimethylsilyl (TMS). Specific examples of cyclopentadienide salts that can be employed include lithium cyclopentadienide, sodium cyclopentadienide, potassium cyclopentadienide and others.

In one embodiment, the method includes adding the two $\eta^n$-coordinated cyclic moieties, e.g., cyclopentadienyl or indenyl moieties, sequentially or step-wise. Thus in one example, the invention is directed to a method for producing a Group 8 (VIII) metallocene and includes the steps of reacting a metal salt compound, a Cp compound, e.g., a first cyclopentadienyl compound, and a ligand (L) compound to form an intermediate compound and reacting the intermediate compound with a Cp' compound, e.g., a second cyclopentadienyl compound, to produce the metallocene.

Preferably, Cp is provided as HCp or a substituted HCp and Cp' is provided as a susbstituted or unsubstituted Cp' anion, as described above. L is an electron pair donor such as, for example, phosphine or a phosphite triester.

In a preferred embodiment, at least one H atom in the Cp moiety is replaced by a substituent group $D_1$. In another preferred embodiment, at least one H atom in the Cp' moiety is replaced by a substituent group $D_1'$. In yet other embodiments, either or both Cp or Cp' includes at least one additional substituent group, $D_x$ or $D_x'$.

$D_1$ and $D_1'$ can be the same or different. $D_1$, $D_1'$, $D_x$ or $D_x'$ groups can be, for example:

X;

$C_{a1}H_{b1}X_{c1}$;

$C_{a2}H_{b2}X_{c2}(C=O)C_{a1}H_{b1}X_{c1}$;

$C_{a2}H_{b2}X_{c2}OC_{a1}H_{b1}X_{c1}$;

$C_{a2}H_{b2}X_{c2}(C=O)OC_{a1}H_{b1}X_{c1}$; and $C_{a2}H_{b2}X_{c2}O(C=O)C_{a1}H_{b1}X_{c1}$;

where

X is a halogen atom, e.g., fluorine (F), chlorine (Cl), bromine (Br) or iodine (I) or a nitro group ($NO_2$);

a1 is an integer from 1 to 8;

b1 is an integer from 0 to 2(a1)+1−c1 c1 is an integer from 0 to 2(a1)+1−b1;

b1+c1 is at least 1;

a2 is an integer from 0 to 8;

b2 is an integer from 0 to 2(a2)+1−c2;

c2 is an integer from 0 to 2(a2)+1−b2.

In another embodiment, a metallocene, e.g., ruthenocene, or a symmetrically substituted metallocene ($D_1=D_1'$) is produced by a method that includes the step of reacting an intermediate compound with a Cp' component, such as an anion in a cyclopentadienide salt, as described above. The intermediate compound can be formed by reacting a metal salt compound with a ligand (L).

The methods described above can be conducted with indenyl, and other cyclic moieties capable of forming $\eta^n$ coordinated compounds, components to form metallocene-like compounds.

The invention has several advantages. For example, the method of the invention is useful in generating CVD precursors that have varied chemical structures and physical properties. The method can be employed to produce ruthenocenes and other Group 8 (VIII) metallocenes, such as, for instance, bis(pentahaptocyclopentadienyl)osmium compounds. The method of the invention can produce unsubstituted, mono-substituted, symmetric and asymmetric di-substituted metallocenes as well as symmetric or asymmetric multi-substituted metallocenes. The method can be employed to form metallocene compounds not previously reported. The method results in relatively high product yields and eliminates the need for using sodium hydride and the safety considerations related to its handling. The method is particularly well-suited for scale-up production since it can be conducted using the same equipment, some of the same reagents and process parameters that can easily be adapted to manufacture a wide range of products. In solution, disubstituted asymmetric metallocenes synthesized by the method of the invention do not appear to participate in ring exchange, thus facilitating final purification steps.

DETAILED DESCRIPTION OF THE INVENTION

Figure 1A:
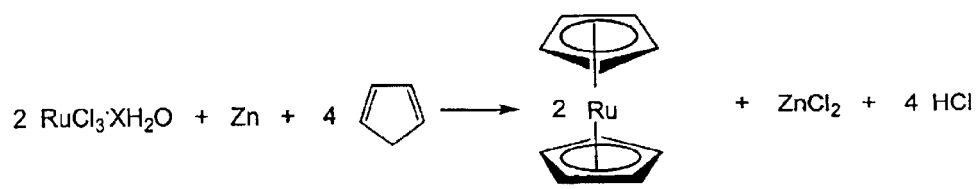
FIG. 1A depicts a prior art synthetic route for forming unsubstituted ruthenocene.
Figure 1B:
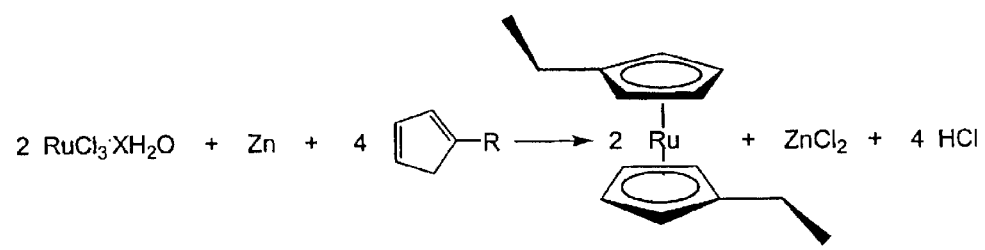
FIG. 1B depicts a prior art synthetic route for forming 1,1'-diethylruthenocene.
Figure 1C:
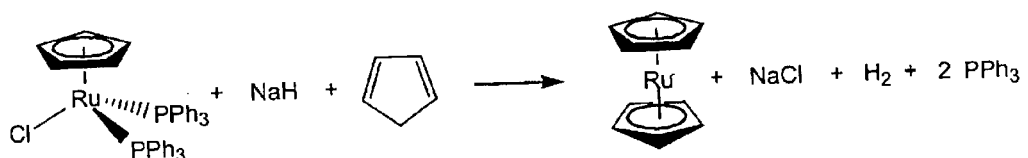
FIG. 1C depicts another prior art method that has been used to form unsubstituted ruthenocene.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

A description of preferred embodiments of the invention follows.

The invention is related to a method for producing metallocenes. As used herein, the term "metallocene" refers to an organometallic coordination compound having a sandwich-type structure similar to that of ferrocene, in which a transition metal is believed to be π-bonded (electrons are moving in orbitals extending above and below the ring) to $\eta^n$-coordinated cyclic, generally aromatic moieties, Cp and Cp', where n indicates the number of carbon atoms in the cyclic moiety that are bonded to the transition metal. If all carbon atoms in the cyclopentadienyl ring participate in bonding to the transition metal, these moieties are described as $\eta^5$-coordinated. Thus, a complete description of ferrocene would be ($\eta^5$-$C_5H_5$)$_2$Fe). Cp and Cp' are independently selected to be unsubstituted or substituted and can be the same or different from one another.

In preferred embodiments, both Cp and Cp' are independently selected to be cyclopentadienyl or indenyl moieties. As known in the art, indenyl include a phenyl ring fused to a cyclopentadienyl ring.

Other examples of Cp and/or Cp' include cyclo-olefin e.g., cyclohexadienyl, cycloheptadienyl, cyclooctadienyl rings, heterocyclic rings, aromatic rings, such as substituted or unsubstituted benzenyl, and others, as known in the art. As used herein, $\eta^n$-coordinated moieties Cp or Cp' that are other than cyclopentadienyl are referred to as "cyclopentadienyllike." Additional counterion groups may be present in such compounds to balance electrical charges and form neutral molecules, as known in the art.

Figure 2A:
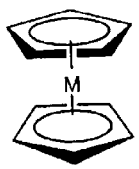
FIG. 2A shows the structural formula of a metallocene in a staggered conformation.
Figure 2B:
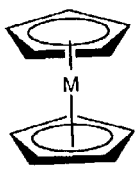
FIG. 2B shows the structural formula of a metallocene in an eclipsed conformation.

Shown in FIG. 2A is a staggered conformation of a metallocene, where M is a group 8 (VIII) metal, e.g., ruthenium, osmium or iron. Metallocenes also can have an eclipsed conformation, as shown in FIG. 2B. As used herein, molecular formulae are not intended to depict a particular metallocene conformation.

In preferred embodiments, the method of the invention employs a cyclopentadienyl or indenyl, anion, such as generally found in the presence of a counterion in cyclopentadienide or cyclopentadienide-like salts. Examples of suitable counterions include Na, Li, K. Mg, Ca, Tl cations or TMS. Specific examples of cyclopentadienide or cyclopentadienide-like salts include but are not limited to LiCp', KCp' or NaCp'.

In one embodiment, the method of the invention includes the steps of combining a metal salt compound, a ligand (L) compound and a first Cp compound, for instance a cyclopentadiene or indene (HCp, to form an intermediate compound; and reacting the intermediate compound with a second Cp' compound, e.g., including a cyclopentadienyl, indenyl or another Cp' anion, such as described above.

The metal salt can be a metal (III) salt, such as, for example, a metal halide (e.g., chloride, bromide, iodide, fluoride), a metal nitrate and other suitable metal salts. M is a Group 8 (VIII) metal, e.g., Ru, Os or Fe. Generally, the metal salt is abbreviated as $MX_n$. As used herein, the abbreviation $MX_n$ does not exclude metal salt compounds that include water of hydration and that, as known in the art, can be more specifically represented by the formula $MX_n \cdot \mu H_2O$, $\mu$ being other than 0. Thus in specific examples, the abbreviation $FeX_3$ used herein includes anhydrous as well as hydrated iron salts that can be employed to form ferrocenes or ferrocene-like compounds.

Ligand (L) generally is an electron pair donor compound. A neutral electron pair donor, such as, for example, triphenylphosphine ($PPh_3$) is employed in one example. Tricyclohexylphosphine and other phosphines of the general formula $PR_3$, as well as phosphite triesters, $P(OR)_3$, where R is phenyl, cyclohexyl, alkyl or branched alkyl, e.g., t-butyl, group, also can be employed. Other suitable electron pair donors include amines, phosphates, carbonyl compounds, olefins, polyolefins, chelating phosphines, chelating amines and others.

Preferably, the Cp compound is HCp, e.g., cyclopentadiene, indene, and can be unsubstituted or substituted. The Cp compound also can be provided as a salt including a cyclopentadienyl or indenyl anion. Suitable cations that can be used with the anion, include, but are not limited to, TMS, Na, Li, K. Mg, Ca and Tl. Specific examples of salts include KCp, NaCp or LiCp.

In one embodiment of the invention, at least one hydrogen (H) atom in the Cp moiety is replaced by a substitutent group $D_1$. Examples of $D_1$ groups include:

X;

$C_{a1}H_{b1}X_{c1}$;

$C_{a2}H_{b2}X_{c2}(C=O)C_{a1}H_{b1}X_{c1}$;

$C_{a2}H_{b2}X_{c2}OC_{a1}H_{b1}X_{c1}$;

$C_{a2}H_{b2}X_{c2}(C=O)OC_{a1}H_{b1}X_{c1}$; and $C_{a2}H_{b2}X_{c2}O(C=O)C_{a1}H_{b1}X_{c1}$;

where

X is F, Cl, Br, I or $NO_2$;

a1 is an integer from 1 to 8;

b1 is an integer from 0 to 2(a1)+1−c1;

c1 is an integer from 0 to 2(a1)+1−b1;

b1+c1 is at least 1;

a2 is an integer from 0 to 8;

b2 is an integer from 0 to 2(a2)+1−c2;

c2 is an integer from 0 to 2(a2)+1−b2.

As used herein, integer ranges are inclusive. Straight as well as branched substituent groups can be employed. For example, $D_1$ can be a straight or branched C8 alkyl group.

The Cp compound can include one or more additional substituent(s) $D_x$. Specific examples of $D_x$ include:

X $C_{a1}H_{b1}X_{c1}$, $C_{a2}H_{b2}X_{c2}(C=O)C_{a1}H_{b1}X_{c1}$, $C_{a2}H_{b2}X_{c2}OC_{a1}H_{b1}X_{c1}$, $C_{a2}H_{b2}X_{c2}(C=O)OC_{a1}H_{b1}X_{c1}$, or $C_{a2}H_{b2}X_{c2}O(C=O)C_{a1}H_{b1}X_{c1}$, where, X is F, Cl, Br, I or $NO_2$;

a1 is an integer from 1 to 8;

b1 is an integer from 0 to 2(a1)+1−c1;

c1 is an integer from 0 to 2(a1)+1−b1;

b1+c1 is equal to or greater than 1;

a2 is an integer from 0 to 8;

b2 is an integer from 0 to 2(a2)+1−c2;

c2 is an integer from 0 to 2(a2)+1−b2; and b2+c2 is equal to or greater than 1.

Specific examples of Cp compound include, methylcyclopentadiene, ethylcyclopentadiene, isopropylcyclopentadiene, tert-butylcyclopentadiene and others.

Each of the $MX_n$, L and Cp components can be provided in neat form or can optionally include a suitable solvent. Preferred solvents that can be employed in the method of the invention include alcohols, such as, for instance, ethanol, methanol, isopropanol and other alcohols. Ethyl acetate, tetrahydrofuran (THF), saturated or unsaturated hydrocarbons, aromatic heterocycles, alkyl halides, silylated hydrocarbons, ethers, polyethers thioethers, esters, lactones, amides, amines, polyamines, nitriles, silicone oils and other aprotic solvents also can be employed. Combinations of solvents also can be employed.

Generally, concentrations of $MX_n$, L and Cp are selected as known in the art. For example, the molar concentration of $MX_n$ in a suitable solvent can be in the range of from about 0.1 M to neat. That of L in a suitable solvent can be in the range of from about 0.1 M to neat. The molar concentration of Cp in a suitable solvent can be in the range of from about 0.1 to neat. If neat phosphine is employed, it is believed that the reaction would be highly exothermic. Methods and systems for dissipating substantial amounts of heat of reaction per unit volume are known in the art.

The three components can be combined in any order. In one example, the metal component and the HCp component are added concurrently to the L component. In another embodiment, the metal component and the HCp component are combined to form a mixture and then the mixture is combined with the L component, for instance by adding the L component to the mixture. In yet another embodiment, all components are combined at the same time.

Typically the molar ratio of HCp to $MX_n$ used is in the range from about 50 to about 1, preferably from about 12 to about 2 and most preferably in the range from about 7 to about 5. Typically, the molar ratio of L to $MX_n$ is in the range of from about 8 to about 0, preferably from about 6 to about 2 and most preferably from about 5 to about 3.5. If a large excess amount of HCp component is employed, the reaction is driven to forming $(Cp)_2M$ product.

The reaction temperature preferably is around the boiling point of the solvent employed or the boiling point of the reaction mixture. Other suitable temperatures can be determined by routine experimentation. Generally, the reaction can be conducted at a temperature that is in the range of from above the freezing point to about the boiling point of the reaction composition. For instance, the reaction can be conducted at a temperature in the range of from about $-100°$ C. to about $150°$ C.

The time of reaction generally depends on temperature, and concentration of the various reactants, and can range, for example, from about 5 minutes to about 96 hours.

The intermediate compound formed by the reaction of the metal salt $MX_n$), L and Cp compound, e.g., HCp, can be represented by the formula $CpML_fX$, where f=1 or 2.

In one example, $CpML_fX$ is isolated, e.g., as a solid, by methods known in the art. Examples of techniques that can be employed to isolate the intermediate compound include filtration, centrifugation and recrystallization.

In another example, no isolation of an intermediate compound from the reaction solution is carried out.

Whether isolated or not, the intermediate compound is reacted with a Cp' compound, preferably in the presence of a solvent.

Cp' preferably is provided as an anion in combination with a counterion, e.g., TMS, Na, Li, K, Mg, Ca, Tl. Specific examples of cyclopentadienide, or cyclopentadienide-like salts that can be employed to provide the Cp' moiety include KCp', LiCp', NaCp' and others.

Cp' can be unsubstituted or substituted. In a preferred embodiment, at least one H atom in the Cp' moiety is replaced by a substituent group $D_1'$. $D_1'$ can be the same or different from $D_1$. Examples of $D_1'$ include:

X;

$C_{a1}H_{b1}X_{c1}$;

$C_{a2}H_{b2}X_{c2}(C=O)C_{a1}H_{b1}X_{c1}$;

$C_{a2}H_{b2}X_{c2}OC_{a1}H_{b1}X_{c1}$;

$C_{a2}H_{b2}X_{c2}(C=O)OC_{a1}H_{b1}X_{c1}$; and $C_{a2}H_{b2}X_{c2}O(C=O)C_{a1}H_{b1}X_{c1}$;

where

X is F, Cl, Br, I or $NO_2$;

a1 is an integer from 1 to 8;

b1 is an integer from 0 to 2(a1)+1−c1;

c1 is an integer from 0 to 2(a1)+1−b1;

b1+c1 is at least 1;

a2 is an integer from 0 to 8;

b2 is an integer from 0 to 2(a2)+1−c2;

c2 is an integer from 0 to 2(a2)+1−b2.

Straight as well as branched substituent groups can be employed. For example, $D_1'$ can be a straight or branched C8 alkyl group.

The Cp' compound can include one or more additional substituent(s) $D_x'$. Specific examples of $D_x'$ include:

X $C_{a1}H_{b1}X_{c1}$, $C_{a2}H_{b2}X_{c2}(C=O)C_{a1}H_{b1}X_{c1}$, $C_{a2}H_{b2}X_{c2}OC_{a1}H_{b1}X_{c1}$, $C_{a2}H_{b2}X_{c2}(C=O)OC_{a1}H_{b1}X_{c1}$, or $C_{a2}H_{b2}X_{c2}O(C=O)C_{a1}H_{b1}X_{c1}$ where, X is F, Cl, Br, I or $NO_2$;

a1 is an integer from 0 to 8 b1 is an integer from 0 to 2(a1)+1−c1 c1 is an integer from 0 to 2(a1)+1−b1 b1+c1 is equal to or greater than 1 a2 is an integer from 0 to 8 b2 is an integer from 0 to 2(a2)+1−c2 c2 is an integer from 0 to 2(a2)+1−b2 b2+c2 is equal to or greater than 1

In specific examples of the invention, intermediate $CpML_fX$ is reacted with sodium or lithium ethylcyclopentadienide, sodium or lithium methylcyclopentadienide, sodium or lithium isopropylcyclopentadienide and others. Di- or multi-substituted (e.g., tri-, tetra- or penta-substituted) cyclopentadienyl anions, in combination with a counter ion, as described above, also can be employed. Anions of substituted or unsubstituted indenes, cyclic poly-olefins, polycyclic unsaturated hydrocarbons, heterocycles, aromatic rings also can be used.

In one example, the intermediate compound is $CpRu(PPh_3)_2Cl$. It is reacted with a salt of Cp'. Recommended salts of Cp' include NaCp', LiCp', $(Cp')_2Mg$, TMS(Cp') and (Cp')Tl.

Examples of suitable solvents for conducting the reaction between $CpML_fX$ and the Cp' component include benzene, toluene, xylenes, pentanes, hexanes, petroleum ether, aromatic heterocycles, saturated or unsaturated hydrocarbons, alkyl halides, silylated hydrocarbons, ethers, polyethers, thioethers, esters, lactones, amides, amines, polyamines, nitriles, silicones, and others.

Generally, the molar concentrations of the Cp' component in a solvent can be in the range of from about 0.1 M to about 3.5 M, preferably in the range of from about 0.5 M to about 2.5 M and most preferably in the range of from about 1.4 to about 1.8 M.

Typically, the molar ratio of Cp' relative to the $CpML_fX$ is in the range from about 50 to about 1, preferably from about 6 to about 1 and most preferably from about 1.6 to about 1.2.

The reaction between the Cp' compound and the intermediate compound (whether isolated or not) is conducted at a temperature such as generally described above and results in the formation of CpMCp' product.

The product of the reaction, CpMCp', can be isolated and or purified by methods known in the art, such as, for example, solvent, e.g., hexane, extraction followed by distillation, sublimation or chromatography or directly by distillation, sublimation or chromatography. Recrystallization, ultracentrifugation and other techniques also can be employed. Alternatively, the product can be employed in the reaction mixture without further isolation and or purification.

Figure 3:
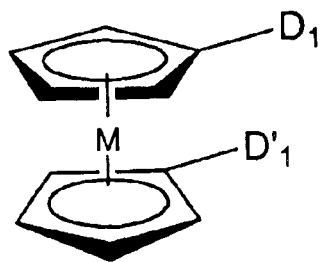
FIG. 3 shows the structural formula of a disubstituted metallocene.
Figure 4:
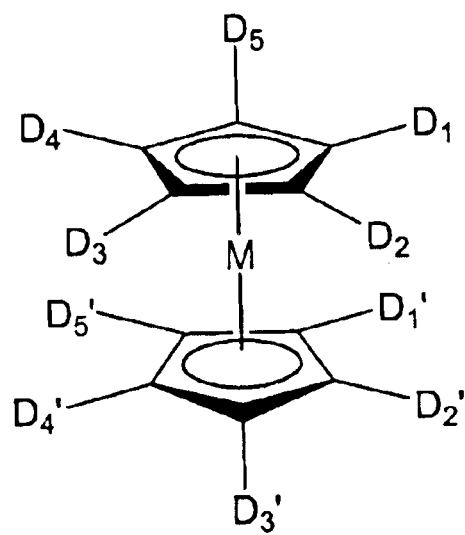
FIG. 4 shows a generalized structural formula of a metallocene.

A structural formula of a metallocene compound produced by the method of the invention and that includes substituent groups $D_1$ and $D_1'$ is shown in FIG. 3. A generalized structural formula of a metallocene compound is shown in FIG. 4. $D_2$, $D_3$, $D_4$, $D_5$, $D_2'$, $D_3'$, $D_4'$, and $D_5'$ can be independently selected from:

X $C_{a1}H_{b1}X_{c1}$, $C_{a2}H_{b2}X_{c2}(C=O)C_{a1}H_{b1}X_{c1}$, $C_{a2}H_{b2}X_{c2}OC_{a1}H_{b1}X_{c1}$, $C_{a2}H_{b2}X_{c2}(C=O)OC_{a1}H_{b1}X_{c1}$, or $C_{a2}H_{b2}X_{c2}O(C=O)C_{a1}H_{b1}X_{c1}$ where, X is F, Cl, Br, I or $NO_2$;

a1 is an integer from 1 to 8 b1 is an integer from 0 to 2(a1)+1−c1 c1 is an integer from 0 to 2(a1)+1−b1 b1+c1 is equal to or greater than 1 a2 is an integer from 0 to 8 b2 is an integer from 0 to 2(a2)+1−c2 c2 is an integer from 0 to 2(a2)+1−b2 b2+c2 is equal to or greater than 1

Figure 5:
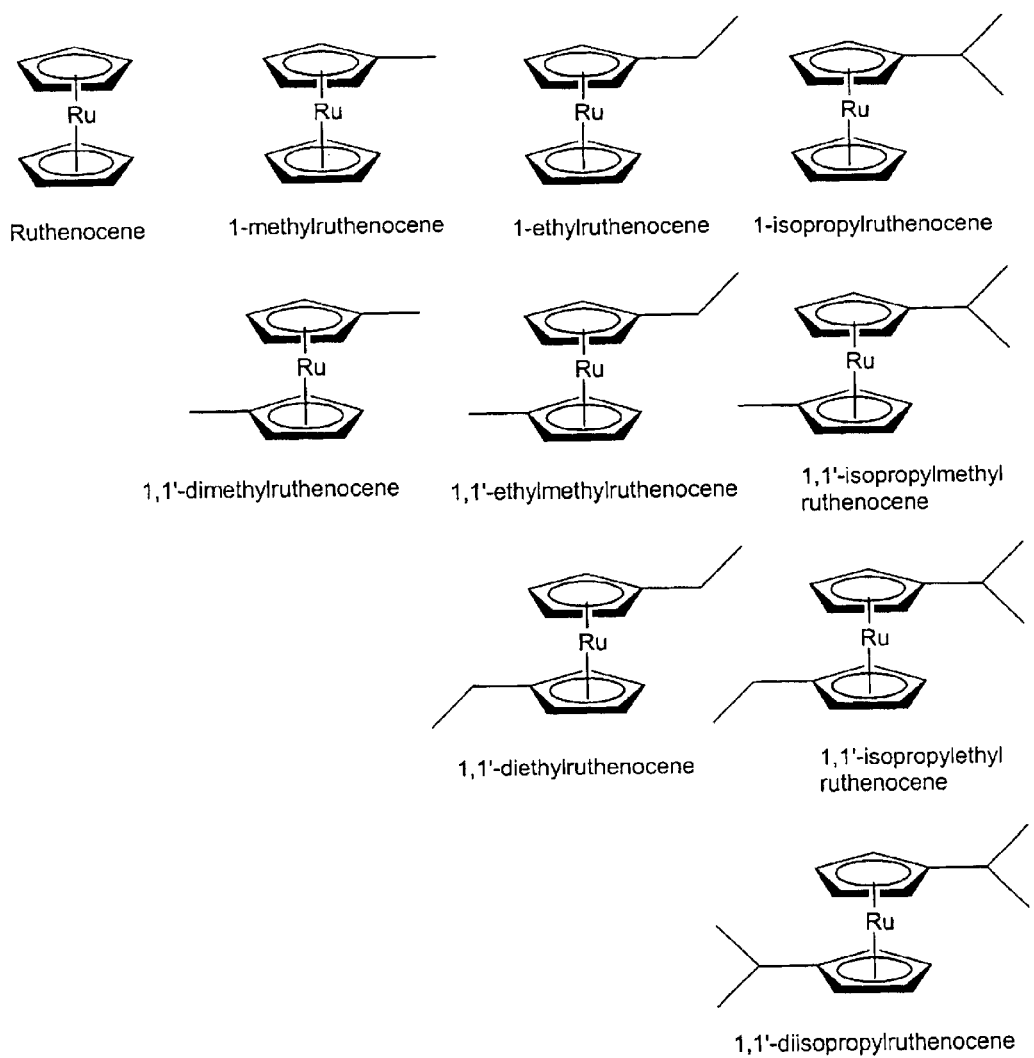
FIG. 5 shows illustrative ruthenocene compounds that can be formed by the method of the invention.

Specific examples of symmetric and asymmetric CpMCp' products that can be formed by this method are shown in FIG. 5. Some examples of asymmetric, disubstituted ruthenocenes that can be produced by the method described above are presented in Table 1.

TABLE 1

| | |
|---|---|
| 1-methyl,1'-ethylruthenocene | 1,2-dimethyl,1'-ethylruthenocene |
| 1-methyl,1'-propylruthenocene | 1-methyl,1',3-diethylruthenocene |
| 1-methyl,1'-isopropylruthenocene | 1-methyl,1',2-diethylruthenocene |
| 1-methyl,1'-butylruthenocene | 1-methyl,1'-ethyl,3-propylruthenocene |
| 1-methyl,1'-secbutylruthenocene | 1-methyl,1'-propyl,3-ethylruthenocene |
| 1-methyl,1'-tertbutylruthenocene | 1-ethyl,1'-methyl,3-propylruthenocene |
| 1-ethyl,1'-propylruthenocene | 1-methyl,1'-ethyl,2-propylruthenocene |
| 1-ethyl,1'-isopropylruthenocene | 1-methyl,1'-propyl,2-ethylruthenocene |
| 1-ethyl,1'-butylruthenocene | 1-ethyl,1'-methyl,2-propylruthenocene |
| 1-ethyl,1'-secbutylruthenocene | 1-methyl,1'-propylruthenocene |
| 1-ethyl,1'-tertbutylruthenocene | 1-methyl-1'-ethylruthenocene |
| 1-propyl,1'-isopropylruthenocene | 1,3-dimethyl-1'-ethylruthenocene |
| 1-propyl,1'-butylruthenocene | 1,2,1'-dmethyl-3'-ethylruthenocene |
| 1-propyl,1'-secbutylruthenocene | 1-butyl-1'-acetylruthenocene |
| 1-propyl,1'-tertbutylruthenocene | 1-ethyl-1'-methoxyruthenocene |
| 1-isopropyl,1'-butylruthenocene | 1-ethyl-1'-methoxy-2-ethoxyruthenocene |
| 1-isopropyl,1'-secbutylruthenocene | 1,2,3,4-tetramethyl-1'-ethylruthenocene |
| 1-isopropyl,1'-tertbutylruthenocene | 1-acetyl,1'-ethoxyruthenocene |
| 1-butyl,1'-secbutylruthenocene | 1-difluoromethyl-1'-ethylruthenocene |
| 1-butyl,1'-tertbutylruthenocene | 1-trifluoromethyl,2,3,4-fluoro-1'-triflouromethylruthenocene |
| 1-secbutylruthenocene,1'-tertbutylruthenocene | 1-ethenyl-1'-fluororuthenocene |
| 1,1',3-trimethylruthenocene | 1-ethoxymethyl-1',2'-diethylruthenocene |
| 1,1',2-trimethylruthenocene | 1-ethyl,1'-propanoylruthenocene |
| 1,3-dimethyl,1'-ethylruthenocene | 1,1',2,4-tetraethyl-3'-acetylruthenocene |

The method of the invention also can be used to form osmium-based compounds and iron-based compounds similar to those shown in FIG. 5 and Table 1. Similarly, the method of the invention can be used to form metallocenes including other $\eta^n$-coordinated aromatic moieties.

Asymmetric metallocene and asymmetric metallocene-like compounds that can be produced by the method of the invention also are described in U.S. Patent Application by David M. Thompson and Cynthia A. Hoover, with the title *Asymmetric Group 8 (VIII) Metallocene Compounds*, filed concurrently herewith under Attorney Docket Number D-21266, the entire teachings of which are incorporated herein by reference.

Figure 6:
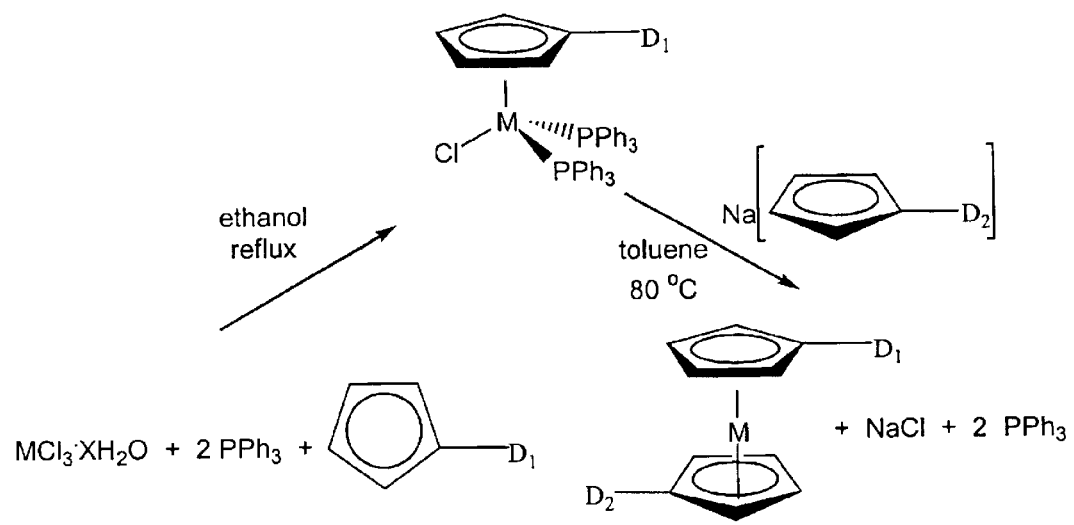
FIG. 6 shows one embodiment of a synthetic method for forming a metallocene compound.

One specific embodiment of the method of the invention is described by the chemical reaction shown in FIG. 6. In the method depicted in FIG. 6, $MCl_3.XH_2O$, triphenylphosphine and a cyclopentadiene react in ethanol, under reflux, to form intermediate compound $CpM(PPh_3)_2Cl$, which then reacts with a sodium ethylcyclopentadienide to form CpMCp. The $D_1$ and $D_2$ substituents seen in FIG. 6 are independently selected as described above.

Figure 7:
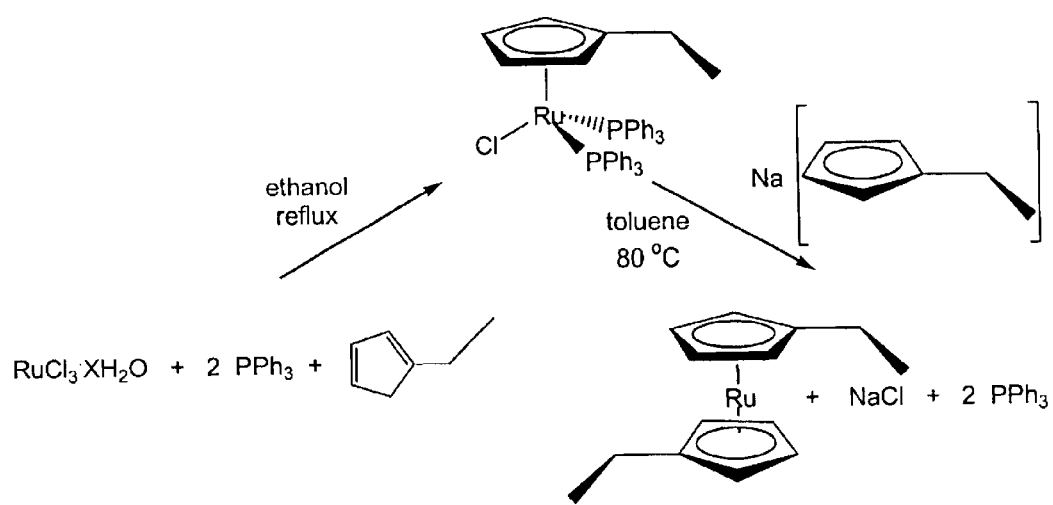
FIG. 7 shows one embodiment of the method of the invention for forming 1,1'-diethylruthenocene.

A specific synthetic scheme for forming 1,1'-diethylruthenocene is shown in FIG. 7. As shown in FIG. 7, $RuCl_3.XH_2O$, triphenylphosphine and ethylcyclopentadiene react in ethanol, under reflux, to form intemediate compound chloro(ethylcyclopentadienyl)bis(triphenylphosphine)ruthenium(II) or $(\eta^5-C_5H_4C_2H_5)Ru(PPh_3)_2Cl$, which then reacts with a sodium ethylcyclopentadienide to form 1,1'-diethylruthenocene.

Figure 8:
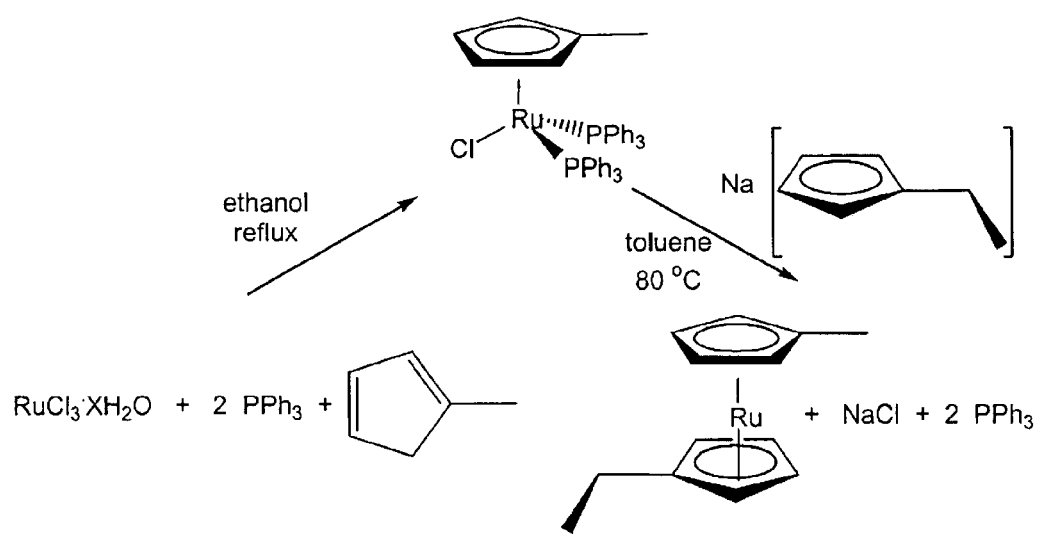
FIG. 8 shows an embodiment of the method of the invention for forming 1-methyl,1'-ethylruthenocene.

A synthetic scheme that can be employed to form a specific di-substituted asymmetric ruthenocene, i.e., 1-methyl,1'-ethylruthenocene or (methylcycplopentadienyl) ethylcyclopentadienyl)ruthenium), is shown in FIG. 8. As shown in FIG. 8, $RuCl_3.XH_2O$, triphenylphosphine and methylcyclopentadiene react in ethanol, under reflux, to form intermediate compound chloro (methylcyclopentadienyl)bis(triphenylphosphine)ruthenium (II) or $(\eta^5-C_5H_4C_2H_5)Ru(PPh_3)_2Cl$, which then reacts with a sodium ethylcyclopentadienide to form 1-methyl,1'-ethylruthenocene.

When synthesizing structures of the type CpRuCp' in which Cp or Cp' includes a ketone, ester or ether functionality, it is preferred that the ring with the greater number of ketones, esters or ethers is identified as the Cp' ring, and that it is added to the intermediate as a TMS salt.

To produce symmetrical metallocenes, e.g., 1,1'-diethylruthenocene, or symmetrical metallocene-like compounds, the method of the invention is modified as follows. A metal (M) salt (X) component and a ligand (L) component are combined to form an intermediate compound. $MX_3 \cdot \eta H_2O$, for example, is combined with triphenylphosphine to form $MX_2(PPh_3)_m$, where m=3 or 4. The intermediate compound can be isolated or is employed without being isolated. The intermediate compound, isolated or in the reaction mixture, is reacted with a Cp' component such as described above.

Figure 9:
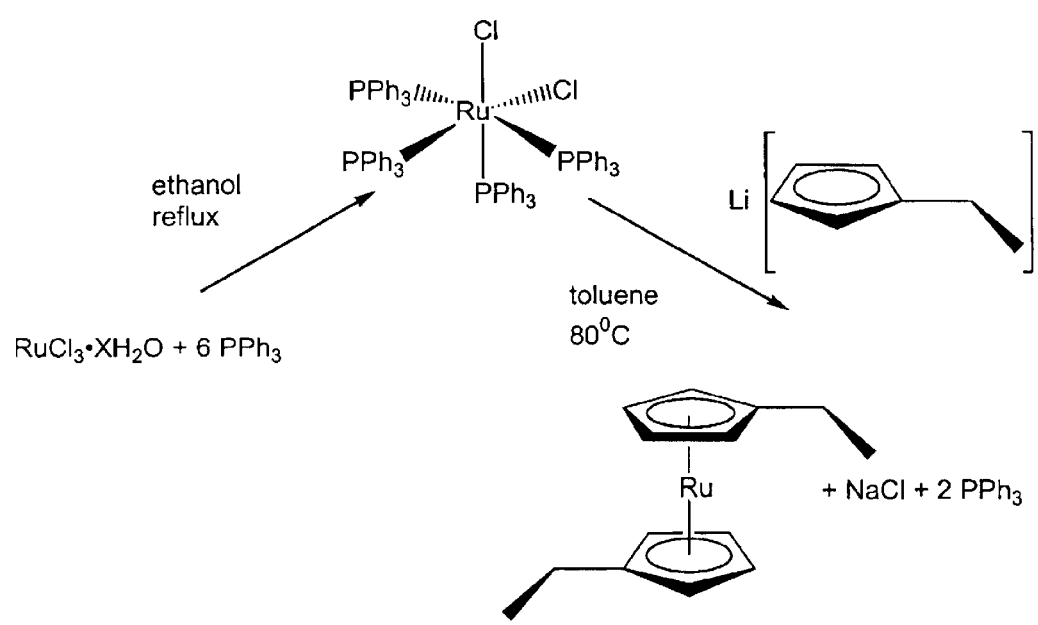
FIG. 9 shows another embodiment of the method of the invention for forming 1,1'-diethylruthenocene.

A specific example of this synthetic route is shown in FIG. 9. As shown in FIG. 9, $RuCl_3 \cdot XH_2O$ is reacted with triphenylphosphine to form $RuCl_2(PPh_3)_4$. $RuCl_2(PPh_3)_3$ can also be formed. This intermediate compound is then reacted with a lithium ethylcyclopentadienide to form 1,1'-diethylruthenocene.

The method of this embodiment of the invention also can be conducted by reacting an intermediate compound, e.g., $RuCl_2(PPh_3)_3$ or $RuCl_2(PPh_3)_4$, that is obtained commercially or is synthesized in a different manner, with a Cp' component, as described above.

The metallocene and metallocene-like compounds produced by the method of the invention are useful in scientific research, for example, in the study and understanding of organometallic chemistry of ferrocene and ferrocene-like molecules and in chemical reactions.

It is believed that the compounds prepared by the method of the invention also can be employed as combustion modifiers for solid propellants. It is believed that in some cases, functionalization of the parent ferrocene may prevent migration of the ferrocene from the rubber like binder matrix of the solid propellant into the surrounding insulation material. Metallocene and metallocene-like compounds prepared as described herein also might find uses as catalysts, for instance, in zeolite-impregnated metallocene catalysts for the reduction of nitrogen oxides or as catalysts in chiral organic synthesis; as iron deficiency supplements for animals and plants; as antioxidants and antiknock agents; as additives for motor fuels and oils; as color pigments; as radiation absorberes; and as insecticides and fungicides.

Metallocene compounds prepared by the method of the invention are particularly useful as precursors in film deposition processes, e.g., CVD processes.

Such processes using asymmetric, disubstituted metallocene precursors are described in the U.S. Patent Application by David M. Thompson, Cynthia A. Hoover, John D. Peck and Michael M. Litwin, entitled *Deposition Processes Using Group* 8 (*VIII*) *Metallocene Precursors,* filed concurrently herewith under Attorney Docket No. D-21267, the entire teachings of which are incorporated herein by reference.

EXEMPLIFICATION

EXAMPLE 1

Step A

A 2 L three-necked round bottomed flask was charged with a Teflon® (perfluorinated polymer, DuPont Corp.) stirring bar, ethanol (1.0 L) and $PPh_3$ (263 g, 1.0 mol). A 250 mL dropping funnel, a 150 mL bath-jacketed dropping funnel, and a condenser were attached to the three necks of the 2L flask. It is important to note that both dropping funnels were equipped with Teflon® (perfluorinated polymer, DuPont Corp.) valves that permitted their isolation from the atmosphere of the round-bottomed flask. A rubber septum was connected to the top of the 150 mL bath-jacketed dropping funnel. The top of the condenser was fitted with an T junction adapter and connected to an inert atmosphere. A heating mantle was placed beneath the 2 L three-necked round-bottomed flask and the solution was stirred and heated to reflux. At reflux all of the triphenylphosphine dissolved in the ethanol. The system was purged with nitrogen for 3 hours while at reflux.

While this was taking place a 500 mL erlenmyer flask was charged with $RuCl_3.XH_2O$ (50 g, 0.20 mol), ethanol (150 mL) and a Teflon® (perfluorinated polymer, DuPont Corp.) coated magnetic stirring bar. The ethanolic solution immediately developed a brown/orange colour. To dissolve all of the $RuCl_3.XH_2O$ it was necessary to slowly heat the solution. This solution was poured into the 250 mL.

While this was taking place a 500 mL erlenmyer flask was charged with $RuCl_3.XH_2O$ (50 g, 0.20 mol), ethanol (150 mL) and a Teflon® (perfluorinated polymer, DuPont Corp.) coated magnetic stirring bar. The ethanolic solution immediately developed a brown/orange colour. To dissolve all of the $RuCl_3.XH_2O$ it was necessary to slowly heat the solution. This solution was poured into the 250 mL dropping-funnel and the dropping-funnel was fitted with a rubber septum. This solution was sparged with nitrogen for 30 minutes by inserting a needle connected to a 1–2 pounds per square inch gauge (psig) nitrogen source through the septum and into the solution and by piercing the septum with another needle to allow for relief of excess pressure.

A methanol/dry ice bath was made up in the 150 mL bath-jacketed dropping funnel. The interior of this droppping funnel was purged with nitrogen for 30 minutes in a similar fashion to which the other dropping funnel was sparged. Ethylcyclopentadiene (116 g, 1.2 mol, freshly distilled under a nitrogen atmosphere) was then cannulated into the cooled dropping funnel through the rubber septum.

After the 3 hours of purging the 2 L-round bottomed flask had elapsed, the Teflon® (perfluorinated polymer, DuPont Corp.) valves isolating the dropping funnels from the rest of the system were both opened and dropwise addition of the two solutions commenced simultaneously. Over the course of 20 minutes the two solutions were both added to the ethanolic PPh3 solution. During this entire time the solution was at reflux. The solution quickly developed a deep orange brown color.

After the addition was completed the solution was left to reflux for an additional 2 hours. During this time small red crystals could be seen accumulating above the meniscus of the solution on the walls of the 2 L flask.

Step B

The solution was allowed to cool to slightly below reflux and the contents of the 2 L flask were filtered (open to air) over a coarse frit. The red/orange solid was collected (198 g). The filtrate was discarded and the solid was placed in a vacuum oven at 60 C overnight.

The solution was allowed to cool to slightly below reflux and the contents of the 2 L flask were filtered (open to air) over a coarse frit. The red/orange solid was collected (198 g). The filtrate was discarded and the solid was placed in a vacuum oven at 60 C overnight.

The solid was removed from the vacuum oven and tared on an analytical balance (150.2 g). Based on this, the yield of crude chloro(ethylcyclopentadienyl)bis(triphenylphosphine)ruthenium(II) was determined to be >99%.

Step C

Next, in a nitrogen glovebox, a 1 L flask was charged with toluene (500 mL, anhydrous), the crude chloro (ethylcyclopentadienyl)bis(triphenylphosphine)ruthenium (II) (150 g, 0.20 mol) and a Teflon® (perfluorinated polymer, DuPont Corp.) stir bar. The solution was stirred and sodium ethylcyclopentadienide (41 g, 0.35 mol) was slowly added over the course of one hour. Following this addition the solution was stirred for 4 hours at 80 C. At this stage the flask was removed from the glovebox and the majority of toluene was removed using a rotary evaporator. Hexanes (500 mL) was then added to the flask and the contents were stirred for 30 minutes. This solution was then filtered through a plug of silica over a coarse frit. A brown/red solid was separated from the yellow/orange filtrate. The filtrate was then placed in a freezer and a crystalline solid ($PPh_3$) precipitated from the solution. The liquid was decanted from the solid and the solution was again concentrated using a rotary evaporator. This solution was left overnight and crystals (PPh3) were evident in the flask the following morning. The liquid was decanted into a 100 mL round-bottomed flask.

The 100 mL round-bottomed flask was fitted with a short path distillation adapter with vigreux indentations and a 100 mL storage flask receptacle. The liquid was distilled under vacuum and a clear yellow liquid, 1,1'-diethylruthenocene containing 3% triphenylphosphine (determined by GCMS and 1H NMR). Spinning band distillation of the yellow liquid afforded 47.6 g (83% yield) of triphenylphosphine free 1,1'-diethylruthenocene in >99.7+% purity (GCMS), with the remaining impurities being attributable to 1-ethylruthenocene and ruthenocene. TGA studies showed that this liquid had less than 0.0001% nonvolatile residue.

EXAMPLE 2

Step A

The procedure of step A was the same as described in Example 1, above.

Specifically, a 2 L three-necked round bottomed flask was charged with a Teflon® (perfluorinated polymer, DuPont Corp.) stirring bar, ethanol (1.0 L) and $PPh_3$ (263 g, 1.0 mol). A 250 mL dropping funnel, a 150 mL bath-jacketed dropping funnel, and a condenser were attached to the three necks of the 2 L flask. Both dropping funnels were equipped with Teflon® (perfluorinated polymer, DuPont Corp.) valves that permitted their isolation from the atmosphere of the round-bottomed flask. A rubber septum was connected to the top of the 150 mL bath-jacketed dropping funnel. The top of the condenser was fitted with a T junction adapter and connected to an inert atmosphere. A heating mantle was placed beneath the 2 L three-necked round-bottomed flask and the solution was stirred and heated to reflux. At reflux all of the triphenylphosphine dissolved in the ethanol. The system was purged with nitrogen for 3 hours while at reflux.

Meanwhile, a 500 mL Erlenmyer flask was charged with $RuCl_3.XH_2O$ (50 g, 0.20 mol), ethanol (150 mL) and a Teflon® (perfluorinated polymer, DuPont Corp.) coated magnetic stirring bar. The ethanolic solution immediately developed a brown/orange color. To dissolve all of the $RuCl_3.XH_2O$ it was necessary to gently heat the solution. This solution was poured into the 250 mL dropping funnel and the dropping funnel was fitted with a rubber septum. This solution was sparged with nitrogen for 30 minutes by inserting a needle connected to a 1–2 pounds per square inch gauge (psig) nitrogen source through the septum and into the solution and by piercing the septum with another needle to allow for relief of excess pressure.

A methanol/dry ice bath was prepared in the 150 mL bath-jacketed dropping tunnel. The interior of this dropping funnel was purged with nitrogen for 30 minutes in a similar fashion to which the other dropping funnel was sparged. Ethylcyclopentadiene (116 g, 1.2 mol, freshly distilled under a nitrogen atmosphere) was then cannulated into the cooled dropping funnel through the rubber septum.

After the 3 hours of purging the 2 L-round bottomed flask had elapsed, the Teflon® (perfluorinated polymer, DuPont Corp.) valves isolating the dropping funnels from the rest of the system were both opened and dropwise addition of the two solutions commenced simultaneously. Over the course of 20 minutes the two solutions were both added to the ethanolic $PPh_3$ solution. During this entire time the solution was at reflux. The solution quickly developed a deep orange brown color.

Step B

Additional ethylcyclopentadiene (116 g, 1.2 mol, freshly distilled under a nitrogen atmosphere) was cannulated into the cooled dropping funnel through the rubber septum as before. The ethylcyclopentadiene was slowly added over the course of 30 minutes while the ethanolic solution continued to reflux.

The solution was allowed to stir for an additional 3 hours. The 2 dropping funnels and the condenser are removed from the 2 L flask and the solution was filtered (while open to air) through a coarse frit. The filtrate was concentrated using reduced pressure (to less than 200 mL). The filtrate was then transferred to a 250 mL round-bottomed flask fitted with a short path distillation adapter with Vigreux indentations to which a 100 mL storage flask receptacle was connected. The liquid was distilled under vacuum and a clear yellow liquid, 1,1'-diethylruthenocene was obtained in 12% yield.

EXAMPLE 3

Step A

A procedure similar to Example I (Step A) was employed. A 5 L five-necked round bottomed flask was equipped with a mechanical stirring paddle through the central neck. It was then charged with ethanol (2.0 L) and PPh3 (420 g, 1.6 mol). Two 500 mL three necked flasks, were connected to two necks of the 5 L four-necked flask via Teflon® (perfluorinated polymer, DuPont Corp.) tubing through positive displacement pumps. The remaining neck of the 5 L flask was equipped with a condenser. A heating mantle was placed beneath the 5 L flask and the solution was stired and heated to reflux. At reflux all of the triphenylphosphine dissolved in the ethanol. The system was purged with nitrogen for 30 minutes while at reflux.

While this was taking place one of the 500 mL round-bottomed flasks was charged with $RuCl_3.XH_2O$ (100 g, 0.40 mol), ethanol (300 mL) and a Teflon® (perfluorinated polymer, DuPont Corp.) coated magnetic stirring bar. The ethanolic solution immediately developed a brown/orange colour. To dissolve all of the $RuCl_3.XH_2O$ it was necessary to heat the solution. This solution was sparged with nitrogen for 30 minutes by inserting a needle connected to a 1–2 pounds per square inch gauge (psig) nitrogen source through the septum and into the solution and by piercing the septum with another needle to allow for relief of excess pressure.

An acetonitrile/dry ice bath was made up and the other 500 mL flask was immersed into this bath. Freshly distilled methylcyclopentadiene (190 g, 270 mL, 2.4 mol, freshly distilled under a nitrogen atmosphere) was then cannulated into the cooled flask.

After the nitrogen sparging of the ethanolic solutions of triphenylphosphine and ruthenium trichloride had completed, the contents of the two 500 mL flasks were pumped into the 5.0 L flask by positive displacement pumps at independent rates so that both additions completed after 5 minutes. To accomplish this the ethylcyclopentadiene was pumped in at a rate of 45 mL/min and the ethanolic ruthenium trichloride was pumped in at a rate of 50 mL/min.

After the addition had been completed the solution was left to reflux for an additional 2 hours. During this time small orange crystals could be seen accumulating above the meniscus of the solution on the walls of the 2 L flask.

Step B

The two positive displacement pumps and Teflon® (perfluorinated polymer, DuPont Corp.) lines were disconnected from the 5 L flask after the 2 hours of stirring. A distillation sidearm was connected one of the necks of the flask and approximately 1 L of ethanol was removed via distillation. Mechanical stirring was discontinued and the orange crystals settled to the bottom of the flask. The solution cooled to room temperature over 3 hours. The solution was then removed from the flask by inserting a piece of glass tubing with a coarse frit attached to the end of it and using reduced pressure to draw the solution through the frit and out of the flask. The crystals were washed with heptane (300 mL) and the heptane was removed in a similar fashion. The washing was carried out three times.

Step C

All of the open ports to the flask were sealed with rubber septa and the flask was evacuated and refilled with nitrogen three times. THF (500 mL, anhydrous) was cannulated into the flask and mechanical stirring was initiated. A THF solution of lithium ethylcyclopentadiene (500 mL, 1.2 M, 0.60 mol) was then cannnulated into the 5 L flask. The contents were heated to reflux and stirred for 4 hours.

After the 4 hours of reflux, stirring was discontinued and the solution was transferred to a 2 L one necked round bottomed flask. This solution was concentrated to a volume of approximately 200 mL on a rotary evaporator. The viscous liquid was then transferred to a 250 mL round bottomed flask.

The 250 mL round-bottomed flask was fitted with a short path distillation adapter with vigreux indentations and a 100 mL storage flask receptacle. The liquid was distilled under vacuum and a clear yellow liquid, 1-methyl, 1'-ethylruthenocene containing some triphenylphosphine (determined by GCMS). Spinning band distillation of the yellow liquid afforded 84.6 g (82% yield) of triphenylphosphine free 1-methyl, 1'-ethylruthenocene in >99% purity (GCMS, 1H NMR), with the remaining impurities being attributable to 1,1'-dimethylruthenocene and 1,1'-diethylruthenocene. TGA studies showed that this liquid had less than 0.01% nonvolatile residue.

EXAMPLE 4

A 2 L three-necked round bottomed flask was charged with a Teflon® (perfluorinated polymer, DuPont Corp.)

stirring bar, ethanol (1.0 L) and PPh$_3$ (263 g, 1.0 mol, 5 eq). A 250 mL dropping funnel, a 150 mL bath-jacketed dropping funnel, and a condenser were attached to the three necks of the 2 L flask. It is important to note that both dropping funnels were equipped with Teflon® (perfluorinated polymer, DuPont Corp.) valves that permitted their isolation from the atmosphere of the round-bottomed flask. A rubber septum was connected to the top of the 150 mL bath-jacketed dropping funnel. The top of the condenser was fitted with an T junction adapter and connected to an inert atmosphere. A heating mantle was placed beneath the 2 L three-necked round-bottomed flask and the solution was stirred and heated to reflux. At reflux all of the triphenylphosphine dissolved in the ethanol. The system was purged with nitrogen for 3 hours while at reflux.

While this was taking place a 500 mL erlenmyer flask was charged with RuCl$_3$.XH$_2$O (50 g, 0.20 mol), ethanol (150 mL, 1 eq) and a Teflon® (perfluorinated polymer, DuPont Corp.) coated magnetic stirring bar. The ethanolic solution immediately developed a brown/orange colour. To dissolve all of the RuCl$_3$.XH$_2$O it was necessary to gently heat the solution. This solution was poured into the 250 mL dropping funnel and the dropping funnel was fitted with a rubber septum. This solution was sparged with nitrogen for 30 minutes by inserting a needle connected to a 1–2 psig nitrogen source through the septum and into the solution and by piercing the septum with another needle to allow for relief of excess pressure.

A methanol/dry ice bath was made up in the 150 mL bath-jacketed dropping funnel. The interior of this droppping funnel was purged with nitrogen for 30 minutes in a similar fashion to which the other dropping funnel was sparged. Methylcyclopentadiene (96.2 g, 1.2 mol, 6 eq, doubly distilled under a nitrogen atmosphere) was then cannulated into the cooled dropping funnel through the rubber septum.

After the 3 hours of purging the 2 L-round bottomed flask had elapsed, the Teflon® (perfluorinated polymer, DuPont Corp.) valves isolating the dropping funnels from the rest of the system were both opened and dropwise addition of the two solutions commenced simultaneously. Over the course of 20 minutes the two solutions were both added to the ethanolic PPh$_3$ solution. During this entire time the solution was at reflux. The solution quickly developed a deep orange brown color. After the addition had been completed the solution was left to reflux for an additional 2 hours. During this time small orange crystals of CpRu(PPh$_3$)$_2$Cl could be seen accumulating above the meniscus of the solution on the walls of the 2 L flask.

A piece of tubing with a coarse porous frit attached to one end was attached to a positive displacement pump. The fritted end of the tubing was immersed in the reactor and all of the liquids were pumped out of the 2 L round-bottomed flask. At this stage the dropping funnels were removed from the reactor. One side was fitted with a K-Head distillation adapter and the other side was fitted with a rubber septum. The flask was evacuated and refilled with nitrogen three times. Working under nitrogen, anhydrous toluene (1.0 L) was cannulated into the 5 L flask through the rubber septum. The dark opaque solution was heated to reflux and the K-head distillation adapter was opened to distill off a fraction of the solvent. Distillate was collected until the head temperature reached 109° C. (It is important to note that in different experiments this consumes different volumes of solvent—typically 400–600 mL of liquid). The solution was then cooled to below reflux.

The flask was then charged with additional toluene to obtain a volume of approximately 600 mL toluene. A lithium ethylcyclopentadienide slurry of toluene (35 g, 0.35 mol, 400 mL) was then cannulated into the reaction pot. Following this addition the solution was stirred for 4 hours at 80° C. At this stage the flask was removed from the glovebox and the majority of toluene was removed using a K-head distillation adapter.

The remaining liquid (approximately 400 mL) was decanted into a 1.0 L round-bottomed flask. This round-bottomed flask was fitted with a short path distillation adapter with vigreux indentations and distilled. The liquid collected from the vigreux column was distilled again using spinning band distillation under vacuum and 44 g of a clear yellow liquid, 1-methyl,1'-ethylruthenocene was obtained in >99% purity (GCMS). TGA studies showed that this liquid had less than 0.01% nonvolatile residue.

EXAMPLE 5

Lithium(ethylcyclopentadienide) was produced as follows. A 2 L three-necked jacketed round bottomed flask was charged with a Teflon® (perfluorinated polymer, DuPont Corp.) stirring bar. A stopcock adapter, a thermowell adapter with thermowell and a rubber septum were fitted to the three necks of the flask. A nitrogen/vacuum manifold was connected to the stopcock adapater and the flask was evacuated and refilled with nitrogen 3 times. Anhydrous toluene (1.0 L) was then cannulated into the flask through the rubber septum and stirring was inititated. A cold fluid circulator was connected to the outer jacket of the jacketed flask with nalgene tubing and a cold fluid (−15° C.) was circulated through the outside wall of the jacketed flask. Once the toluene reached −10° C., freshly distilled ethylcyclopentadiene (middle cut distilled on a vigreux column) was cannulated into the flask (127 g, 1.35 mol). While stirring, n-butyllithium (800 mL, 1.6 M in hexanes, 1.28 mol) was slowly cannulated at a rate that kept the temperature below 0° C. (approximately 2 hours). During the addition of the n-butyllithium a fine white precipitate (lithium ethylcyclopentadienide) became evident in the solution.

This material could be used as a suspension or isolated as a solid via filtration and removal of solvent.

EXAMPLE 6

A 5 L three-necked round bottomed flask with a thermowell was fitted with a 250 mL addition funnel, a 24/40 stopper, and a K-head distillation adapter equipped with a spiral condenser and a 10/30 thermowell. To this apparatus, denatured ethanol (2.0 L) and PPh$_3$ (790 g, 3.01 mol 6 eq) were added. Only a small fraction of the PPh$_3$ was dissolved at this stage. The contents of the flask were purged with nitrogen for 30 minutes while it was mechanically stirred. Following the N$_2$ purge the solution was heated to reflux with a heating mantle. The solution is clear and colorless at this point.

While the solution is heated to reflux, RuCl$_3$.XH$_2$O (124 g, 0.50 mol 1 eq) was dissolved in ethanol (250 mL) in a 500 mL Erlenmyer Flask. It was necessary to heat the solution to 50° C. to dissolve all of the RuCl$_3$.XH$_2$O. This opaque brown colored solution was transferred to the addition funnel. It was then purged with N$_2$ for 15 minutes in the addition funnel.

The ethanolic RuCl$_3$.XH$_2$O solution was added over the course of 25 minutes to the refluxing ethanolic PPh$_3$ solution below. The rate of addition was governed by an exotherm and the ability of the condenser to adequately condense the boiling ethanol. During the course of the addition small burgundy crystals became evident in the solution. Following the addition, the solution was stirred at reflux for an additional 1.5 hours. Following this, heating was discontinued and the contents of the flask were allowed to cool to room temperature with stirring. Stirring was discontinued at this point and the contents in the flask were exposed to air.

A piece of tubing with a coarse porous frit attached to one end was attached to a positive displacement pump. The fritted end of the tubing was immersed in the reactor and all of the liquids were pumped out of the 5 L round-bottomed flask. At this stage the reactor was sealed with a rubber septum and was evacuated and refilled with nitrogen three times. Working under nitrogen, anhydrous toluene (1.0 L) was cannulated into the 5 L flask through the rubber septum. The dark opaque solution was heated to reflux and the K-head distillation adapter was opened to distill off a fraction of the solvent. Distillate was collected until the head temperature reached 109° C. the boiling point of toluene in their environment (it is important to note that in different experiments this consumes different volumes of solvent, typically 400–600 mL of liquid). The solution was then cooled to below reflux.

A toulene/hexane slurry of lithium ethylcyclopentadienide (1.28 mol, 1.9 L toluene/hexane, 2.6 eq) was then cannulated through ¼" tubing into the 5 L round-bottomed flask. Following this addition the solution develops a burgundy color. The reaction was subsequently heated to reflux for 4 hours. Over the course of the reflux the burgundy color was initially replaced by an orange color and orange crystals were evident. This then changed to a much darker solution and the orange crystals were consumed. The solvent was distilled off using the K-Head Distillation adapter to reduce the volume to approximately 900 mL. The remaining oil was transferred to a 2000 mL round-bottomed flask and a functional vacuum distillation was employed to obtain 1,1'-diethylruthenocene.

The 1,1'-diethylruthenocene obtained via this method was 97% pure. Further purification via spinning band distillation afforded an 84% yield (121 g) of 99.9+% (by GCMS) 1,1'diethylruthenocene. This material was 99.999+% pure on a metal basis (ICPMS) and had a non-volatile residue of <0.1%. It is likely unnecessary to employ spinning band distillation to achieve these purities.

EXAMPLE 7

In a nitrogen glovebox, a 250 mL flask was charged with THF (50 mL, anhydrous, inhibitor free), chloro (ethylcyclopentadienyl)bis(triphenylphosphine)ruthenium (II) (3.22 g, 0.004 mol, 1 equivalent) and a Teflon® (perfluorinated polymer, DuPont Corp.) stirring bar. The solution was stirred and a burgundy colored THF solution of sodium isopropylcyclopentadienide was slowly added (0.20 M, 30 mL, 1.5 equivalents). Following the addition the solution developed a deep red color. Within 30 minutes, the meniscus appeared yellow in color. The solution was stirred overnight.

An aliquot (1.0 mL) was taken from the solution and was analyzed by GC/MS. A peak with a mass of 301 g/mol was observed consistent with the 1-ethyl-1'-isopropylruthenocene. Other peaks with masses consistent with the presence of alkylcyclopentadiene dimers, 1,1'-diethylruthenocene, 1,1'-diisopropylruthenocene and triphenylphosphine were also observed.

The THF solvent was then removed from the flask under reduced pressure. The 250 mL flask was fitted with a vacuum jacketed short path distillation adapter and the contents of the flask were distilled under reduced pressure (~0.1 torr). A pale yellow liquid was collected (0.72 g). This liquid was then purified via chromatography. A silica gel in pentane solution was used. The column had a diameter of 0.75" and a 6" length. 0.53 g of 99+% pure 1-ethyl-1'-isopropylruthenocene were isolated via chromatography (41% yield).

EXAMPLE 8

In a nitrogen glovebox, a 250 mL flask was charged with THF (50 mL, anhydrous, inhibitor free), chloro (methylcyclopentadienyl)bis(triphenylphosphine)ruthenium (II) (5.02 g, 0.007 mol, 1 equivalent) and a Teflon® (perfluorinated polymer, DuPont Corp.) stirring bar. The solution was stirred and a burgundy colored THF solution of sodium isopropylcyclopentadienide was slowly added (0.20 M, 50 mL, 1.5 equivalents). Following the addition the solution developed a deep red color. Within 30 minutes, the meniscus appeared yellow in color. The solution was stirred overnight.

An aliquot (1.0 mL) was taken from the solution and was analyzed by GC/MS. A peak with a mass of 287 g/mol was observed consistent with 1-methyl-1'-isopropylruthenocene. Other peaks with masses consistent with the presence of alkylcyclopentadiene dimers, 1,1'-dimethylruthenocene, 1,1'-diisopropylruthenocene and triphenylphosphine were also observed.

The THF solvent was then removed from the flask under reduced pressure. The 250 mL flask was fitted with a vacuum jacketed short path distillation adapter and the contents of the flask were distilled under reduced pressure (~0.1 torr). A pale yellow liquid was collected (1.78 g). This liquid was then purified via chromatography. A silica gel in pentane solution was used. The column had a diameter of 0.75" and a 6" length. 1.03 g of 98+% pure 1-methyl-1'-isopropylruthenocene were obtained after chromatography (53% yield).

EXAMPLE 9

A 100 mL flask was charged with chloro (ethylcyclopentadienyl)bis(triphenylphosphine)ruthenium (II) (5.16 g, 0.007 mol, 1 equivalent) and a Teflon® (perfluorinated polymer, DuPont Corp.) stir bar. The flask was connected to a nitrogen/vacuum manifold and subjected to 3 evacuation/nitrogen refill cycles. THF (50 mL, anhydrous, inhibitor free) was cannulated into the 100 mL round-bottomed flask and the contents were stirred. A NaCp solution (2.0 M, 5 mL, 1.5 equivalent) was then cannulated into the 100 mL round-bottomed flask. The solution exhibited a deep burgundy color. The solution was stirred overnight.

The THF solvent was then removed from the flask under reduced pressure. The 100 mL flask was fitted with a short path distillation adapter and the contents of the flask were distilled under reduced pressure (~0.1 torr). A pale yellow liquid was collected. This yellow liquid was purified using the same chromatographic method as described above for other dialkyldicylcopentadieneruthenium(II) species. 1.03 g of 98+% pure 1-ethylruthenocene were isolated.

EXAMPLE 10

In a nitrogen glovebox, a 250 mL flask was charged with bis(propylcyclopentadienyl)magnesium (5.15 g, 0.02 mol, 1 equivalent), chloro(methylcyclopentadienyl)bis (triphenylphosphine)ruthenium(II) (5.02 g, 0.007 mol, 1 equivalent) and a Teflon® (perfluorinated polymer, DuPont Corp.) stirring bar. Toluene (120 mL, anhydrous, inhibitor free) was cannulated into the 250 mL round-bottomed flask and the contents were stirred. Following the addition of solvent the solution developed a deep red color.

The toluene solvent was then removed from the flask under reduced pressure. The toluene solvent was removed under reduced pressure and the flask was fitted with a short path distillation adapter. The distillate was collected and the GC/MS revealed that the main cut from the short path distillation was 88.7% pure 1-propyl-1'-ethylruthenocene.

Equivalents

While this invention has been particularly shown and described with references to preferred embodiments thereof, it will be understood by those skilled in the art that various changes in form and details may be made therein without departing from the scope the scope of the invention encompassed by the appended claims.

What is claimed is:

1. A method for producing a Group 8 (VIII) metallocene compound, comprising the steps of:

a) reacting a metal salt ($MX_n$) compound, a Cp compound and a ligand (L) to form an intermediate compound; and b) reacting the intermediate compound with a Cp' compound to produce the metallocene compound, wherein, M is selected from the group consisting of Ru, Os and Fe;

L is an electron pair donor;

Cp and Cp' are $\eta^n$-coordinated moieties that and are both unsubstituted or either or both of Cp and Cp' includes at least one substituent that is selected form the group consisting of:

X;
    $C_{a1}H_{b1}X_{c1}$;
    $C_{a2}H_{b2}X_{c2}(C=O)C_{a1}H_{b1}X_{c1}$;
    $C_{a2}H_{b2}X_{c2}OC_{a1}H_{b1}X_{c1}$;
    $C_{a2}H_{b2}X_{c2}(C=O)OC_{a1}H_{b1}X_{c1}$; and
    $C_{a2}H_{b2}X_{c2}O(C=O)C_{a1}H_{b1}X_{c1}$;

where

X is F, Cl, Br, I or $NO_2$;
    a1 is an integer from 1 to 8;
    b1 is an integer from 0 to 2(a1)+1−c1;
    c1 is an integer from 0 to 2(a1)+1−b1;
    b1+c1 is at least 1;
    a2 is an integer from 0 to 8;
    b2 is an integer from 0 to 2(a2)+1−c2;
    c2 is an integer from 0 to 2(a2)+1−b2.

2. The method of claim 1, further including the step of isolating the intermediate compound.

3. The method of claim 1, wherein the Cp compound is a substituted or unsubstituted cyclopentadiene.

4. The method of claim 1, wherein Cp' is an anion of a substituted or unsubstituted cyclopentadiene compound.

5. The method of claim 1, wherein the Cp' compound is a cyclopentadienide salt.

6. The method of claim 1, wherein Cp' is the same as Cp.

7. The method of claim 1, wherein Cp is different from Cp'.

8. The method of claim 1, wherein $MX_n$ is an anhydrous or a hydrated metal halide or metal nitrate.

9. The method of claim 1, wherein L is a phosphine or a phosphine triester.

10. The method of claim 1, wherein at least one of $MX_nL$, Cp or Cp' is present in a solvent.

11. The method of claim 1, wherein $MX_n$, L and Cp are reacted in a solvent medium.

12. The method of claim 11, wherein $MX_n$, L and Cp are reacted at the boiling temperature of the reaction mixture.

13. The method of claim 1, wherein the intermediate compound and Cp' are reacted is a second solvent medium.

14. The method of claim 13, wherein the intermediate compound and Cp' are reacted at the boiling temperature of the reaction mixture.

15. The method of claim 1, wherein the intermediate compound is not isolated prior to being reacted with the Cp' compound.

16. The method of claim 1, wherein, either or both of Cp or Cp' includes at least one additional substituent selected from the group consisting of:

X
    $C_{a1}H_{b1}X_{c1}$,
    $C_{a2}H_{b2}X_{c2}(C=O)C_{a1}H_{b1}X_{c1}$,
    $C_{a2}H_{b2}X_{c2}OC_{a1}H_{b1}X_{c1}$,
    $C_{a2}H_{b2}X_{c2}(C=O)OC_{a1}H_{b1}X_{c1}$, or
    $C_{a2}H_{b2}X_{c2}O(C=O)C_{a1}H_{b1}X_{c1}$ where, X is F, Cl, Br, I or $NO_2$;
    a1 is an integer from 0 to 8
    b1 is an integer from 0 to 2(a1)+1−c1
    c1 is an integer from 0 to 2(a1)+1−b1
    b1+c1 is equal to or greater than 1
    a2 is an integer from 0 to 8
    b2 is an integer from 0 to 2(a2)+1−c2
    c2 is an integer from 0 to 2(a2)+1−b2
    b2+c2 is equal to or greater than 1.

17. A method for producing a Group 8 (VIII) symmetrical metallocene compound, comprising the steps of reacting $MX_2(PPh_3)_m$ with a Cp' compound, wherein M is Ru, Os or Fe, m=3 or 4, X is F, Cl, Br or I, Cp' is a cyclopendadienyl anion and the Cp' compound is a cyclopentadienide salt.

18. The method of claim 17, further comprising the step of forming the $MX_2(PPh_3)_m$ by reacting a metal salt ($MX_n$) with triphenylphosphine.

19. The method of claim 18, wherein $MX_n$ is an anhydrous or a hydrated metal halide or a metal nitrate.

* * * * *